US011929442B2

(12) United States Patent
Preisler

(10) Patent No.: US 11,929,442 B2
(45) Date of Patent: Mar. 12, 2024

(54) STRUCTURE AND METHOD FOR PROCESS CONTROL MONITORING FOR GROUP III-V DEVICES INTEGRATED WITH GROUP IV SUBSTRATE

(71) Applicant: Newport Fab, LLC, Newport Beach, CA (US)

(72) Inventor: Edward Preisler, San Clemente, CA (US)

(73) Assignee: Newport Fab, LLC, Newport Beach, CA (US)

(*) Notice: Subject to any disclaimer, the term of this patent is extended or adjusted under 35 U.S.C. 154(b) by 171 days.

(21) Appl. No.: 16/792,551

(22) Filed: Feb. 17, 2020

(65) Prior Publication Data
US 2021/0217908 A1    Jul. 15, 2021

Related U.S. Application Data

(63) Continuation-in-part of application No. 16/745,805, filed on Jan. 17, 2020, now Pat. No. 11,349,280, and
(Continued)

(51) Int. Cl.
| | | |
|---|---|---|
| H01L 31/0304 | (2006.01) | |
| H01L 31/0232 | (2014.01) | |
| H01L 31/0352 | (2006.01) | |
| H01L 31/18 | (2006.01) | |
| G01R 1/073 | (2006.01) | |

(52) U.S. Cl.
CPC .. *H01L 31/02325* (2013.01); *H01L 31/03046* (2013.01); *H01L 31/035236* (2013.01); *H01L 31/035281* (2013.01); *H01L 31/1844* (2013.01); *H01L 31/186* (2013.01); *G01R 1/07342* (2013.01)

(58) Field of Classification Search
CPC ...... H01S 5/0042; H01S 5/0202; H01S 5/021; H01S 5/0218; H01L 31/03046; H01L 31/1844
See application file for complete search history.

(56) References Cited

U.S. PATENT DOCUMENTS 5,937,274 A * 8/1999 Kondow ........... H01L 21/02392
438/47
5,963,828 A    10/1999 Allman et al.
(Continued)

FOREIGN PATENT DOCUMENTS

CN    102487046 A    6/2012

OTHER PUBLICATIONS

Thomas Ferrotti. Design, Fabrication and Characterization of a Hybrid III-V on Silicon Transmitter for High-Speed Communications. Other. Université de Lyon, 2016. English. NNT : 2016LYSEC054. tel-01529424. pp. 1-181.
(Continued)

*Primary Examiner* — Michael Carter
(74) *Attorney, Agent, or Firm* — Farjami & Farjami LLP

(57) ABSTRACT

A semiconductor structure includes a group IV substrate including group IV dies separated by a scribe line. A group IIIV-chiplet is situated over the group IV substrate at least partially over the scribe line. A group III-V process control monitoring device in the group III-V chiplet is situated over the scribe line. Functional group III-V optoelectronic devices can be situated over the group IV dies.

20 Claims, 9 Drawing Sheets

Related U.S. Application Data a continuation-in-part of application No. 16/741,565, filed on Jan. 13, 2020, now Pat. No. 11,545,587, and a continuation-in-part of application No. 16/740,173, filed on Jan. 10, 2020, now Pat. No. 11,581,452.

(56) References Cited

U.S. PATENT DOCUMENTS

| | | | |
|---|---|---|---|
| 6,645,829 | B2 | 11/2003 | Fitzergald |
| 7,834,456 | B2 | 11/2010 | Tabatabaie et al. |
| 8,633,496 | B2 | 1/2014 | Hata et al. |
| 9,318,437 | B1 | 4/2016 | He et al. |
| 9,331,076 | B2 | 5/2016 | Bayram et al. |
| 9,508,640 | B2 | 11/2016 | Cheng et al. |
| 9,653,347 | B1 | 5/2017 | Leobandung et al. |
| 2003/0213953 | A1* | 11/2003 | Sohn .............. H01L 22/34 257/618 |
| 2004/0124424 | A1 | 7/2004 | Tatsumi |
| 2006/0183327 | A1 | 4/2006 | Moon |
| 2008/0070355 | A1 | 3/2008 | Lochtefeld et al. |
| 2009/0016399 | A1 | 1/2009 | Bowers |
| 2011/0095331 | A1 | 4/2011 | Hanawa et al. |
| 2012/0074980 | A1* | 3/2012 | Choi .............. H01L 22/34 324/762.01 |
| 2012/0288971 | A1 | 11/2012 | Bogaerts et al. |
| 2015/0075599 | A1 | 3/2015 | Yu et al. |
| 2015/0318283 | A1 | 11/2015 | Bayram et al. |
| 2016/0105247 | A1 | 4/2016 | Cheng et al. |
| 2016/0148959 | A1 | 5/2016 | Cheng et al. |
| 2016/0380126 | A1 | 12/2016 | Barkhouse et al. |
| 2019/0189603 | A1 | 6/2019 | Wang et al. |
| 2019/0391328 | A1 | 12/2019 | Li et al. |
| 2020/0274321 | A1 | 8/2020 | Ghegin et al. |

OTHER PUBLICATIONS

Elodie Ghegin "Integration of Innovative Ohmic Contacts for Heterogeneous III-V/Silicon Photonic Devices" HAL Jan. 16, 2018. pp. 1-295.

* cited by examiner

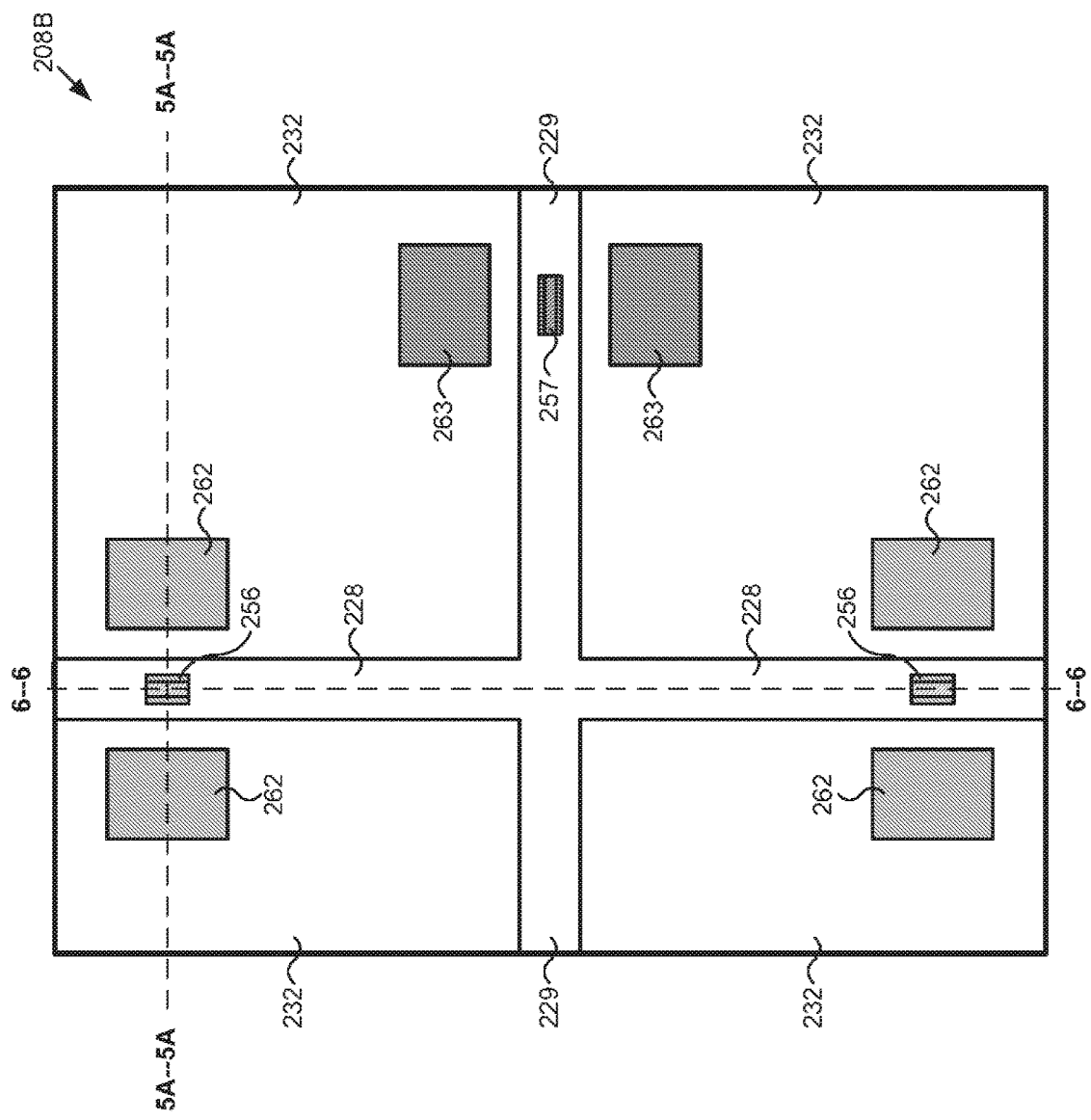

STRUCTURE AND METHOD FOR PROCESS CONTROL MONITORING FOR GROUP III-V DEVICES INTEGRATED WITH GROUP IV SUBSTRATE

CLAIMS OF PRIORITY

The present application is a continuation-in-part of and claims the benefit of and priority to application Ser. No. 16/740,173 filed on Jan. 10, 2020 and titled "Semiconductor Structure Having Group III-V Device on Group IV Substrate and Contacts with Precursor Stacks". The present application is also continuation-in-part of and claims the benefit of and priority to application Ser. No. 16/741,565 filed on Jan. 13, 2020 and titled "Semiconductor Structure Having Group III-V Device on Group IV Substrate and Contacts with Liner Stacks". The present application is also continuation-in-part of and claims the benefit of and priority to application Ser. No. 16/745,805 filed on Jan. 17, 2020 and titled "Semiconductor Structure Having Group III-V Device on Group IV Substrate". The disclosures and contents of the above-identified applications are hereby incorporated fully by reference into the present application.

BACKGROUND

In order to produce reliable high-quality semiconductor devices and integrated circuits, fabrication processes need to be strictly controlled. Process control monitoring enables engineers to detect and diagnose problems early on and minimize their impact. Many process control monitoring devices can be used to detect these problems. However, cost and complexity of implementing process control monitoring devices generally increases with the complexity of the fabrication processes.

For example, group III-V compound semiconductors including at least one group III element, such as indium (In), gallium (Ga), aluminum (Al), and boron (B), and at least one group V element, such as arsenic (As), phosphorus (P), and nitrogen (N), have characteristics that make them advantageous for use in optoelectronic devices. However, operations that are incidental to and supportive of these optoelectronic devices, such as feedback, modulation, and input/output coupling, may be more easily implemented using group IV semiconductors, such as silicon. Fabricating integrating group III-V and group IV optoelectronic devices is often complex, requiring compensating for optical and/or electrical losses, overheating, and incompatible process technologies. Implementing process control monitoring devices for such integrated group III-V and group IV devices further increases cost and complexity.

In one approach, a small number of dies of a substrate are reserved for process control monitoring devices. This approach reduces the number of dies reserved for functional devices, reducing productivity. In another approach, patterned monitoring devices are aligned and placed over scribe lines of a substrate. This approach can be inaccurate, especially where the scribe lines are narrow, and can slow production. Compensating for inaccurate alignment by using wide scribe lines reduces functional die area. Further, where the monitoring devices are patterned separately from the integrated group III-V and group IV devices, additional processing actions are required.

Thus, there is need in the art for efficiently and effectively implementing process control monitoring devices for integrated group III-V and group IV devices with improved productivity and reduced complexity.

SUMMARY

The present disclosure is directed to structure and method for process control monitoring for group III-V devices integrated with group IV substrate, substantially as show in and/or described in connection with at least one of the figures, and as set forth in the claims.

BRIEF DESCRIPTION OF THE DRAWINGS

FIG. 5B illustrates a layout of a portion of a se conductor structure corresponding to FIG. 5A processed in accordance with the flowchart of FIG. 1 according to one implementation of the present application.

DETAILED DESCRIPTION

Figure 1:
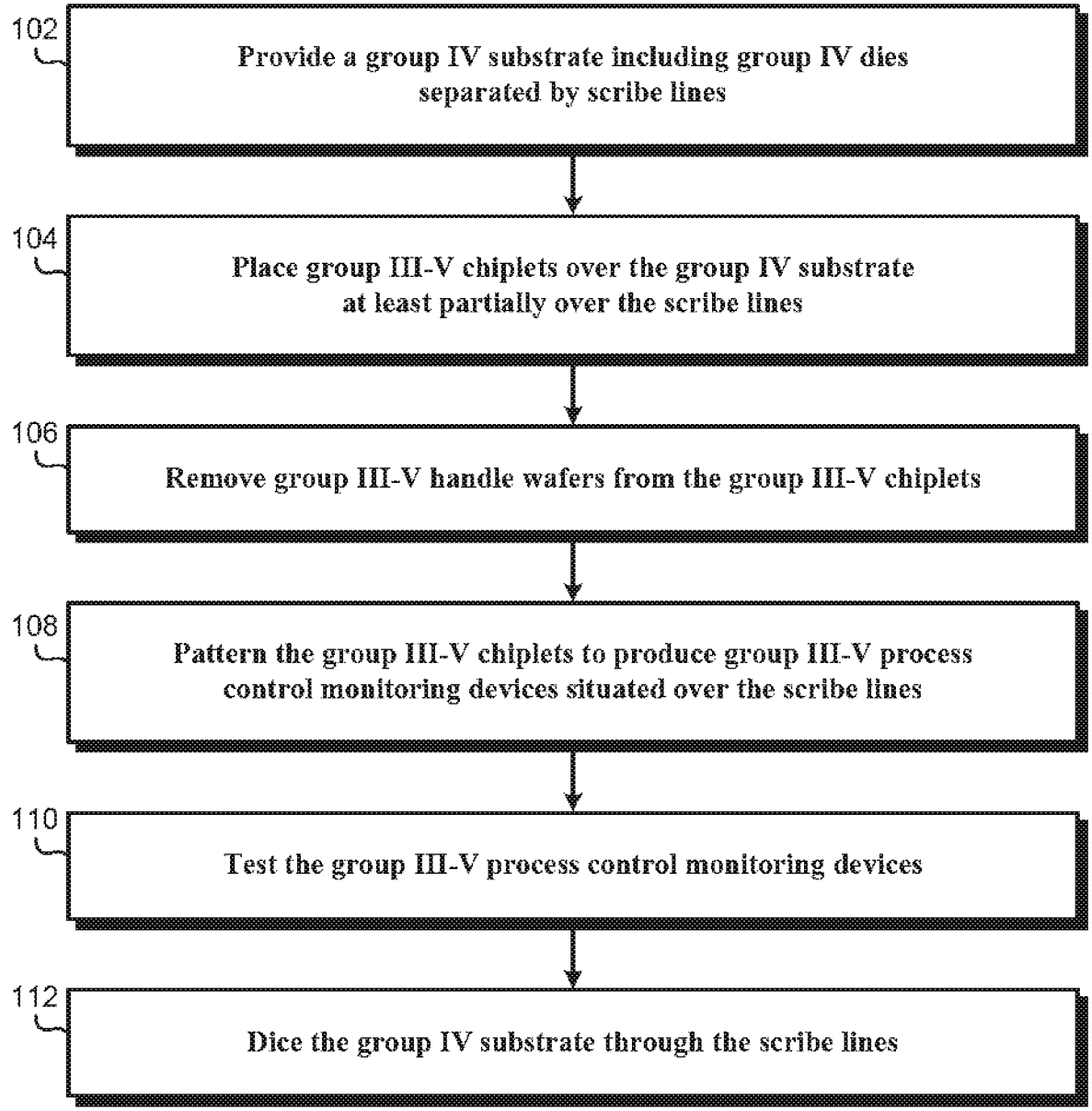
FIG. 1 illustrates a flowchart of an exemplary method for manufacturing a semiconductor structure according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a portion of a flowchart of an exemplary method for manufacturing a semiconductor structure according to one implementation of the present application. FIG. 1 illustrates a portion of a flowchart of an exemplary method for manufacturing a semiconductor structure according to one implementation of the present application.

Figure 2A:
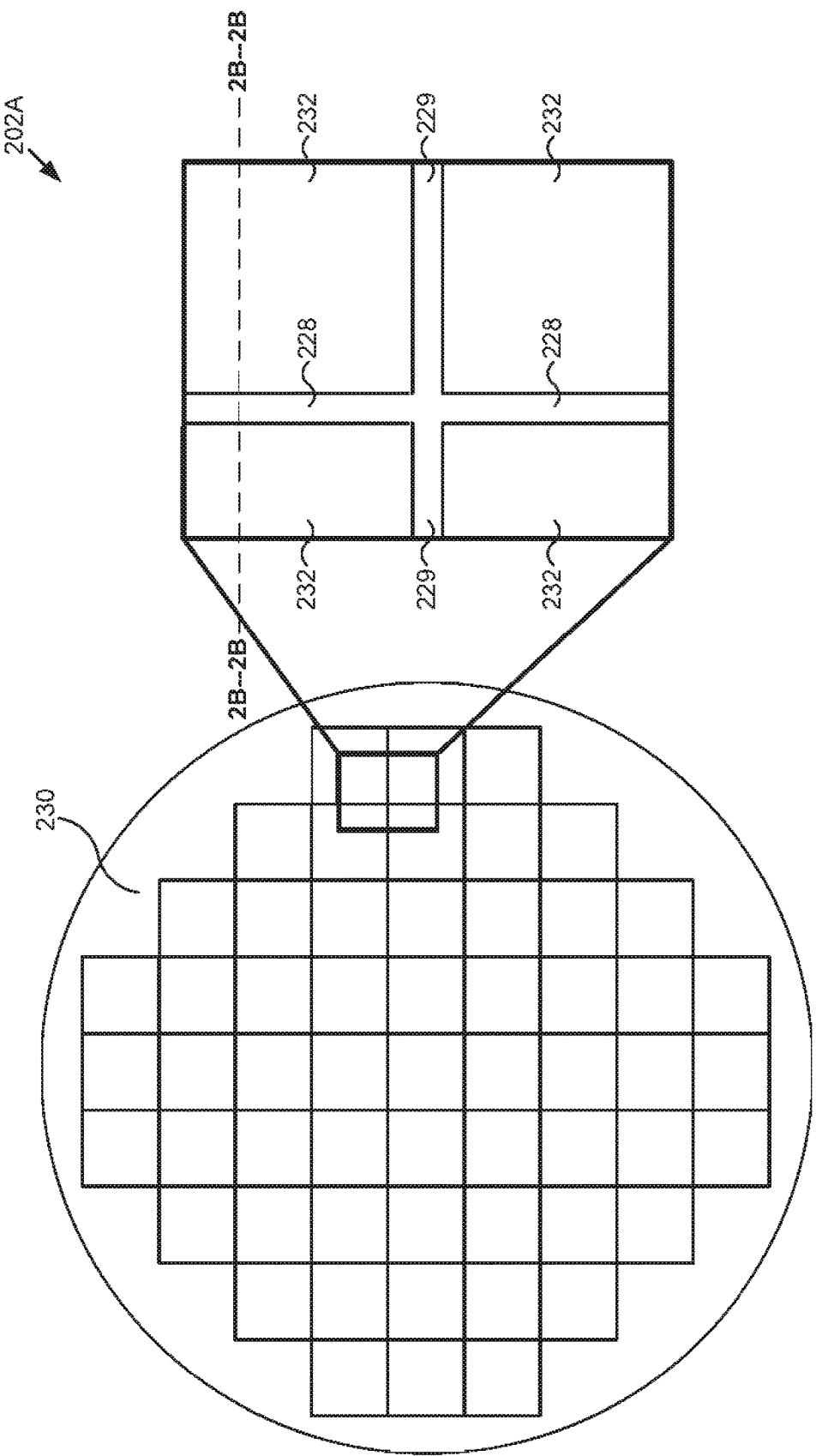
FIG. 2A illustrates a layout of a portion of a semiconductor structure processed in accordance with the flowchart of FIG. 1 according to one implementation of the present application.
Figure 2B:
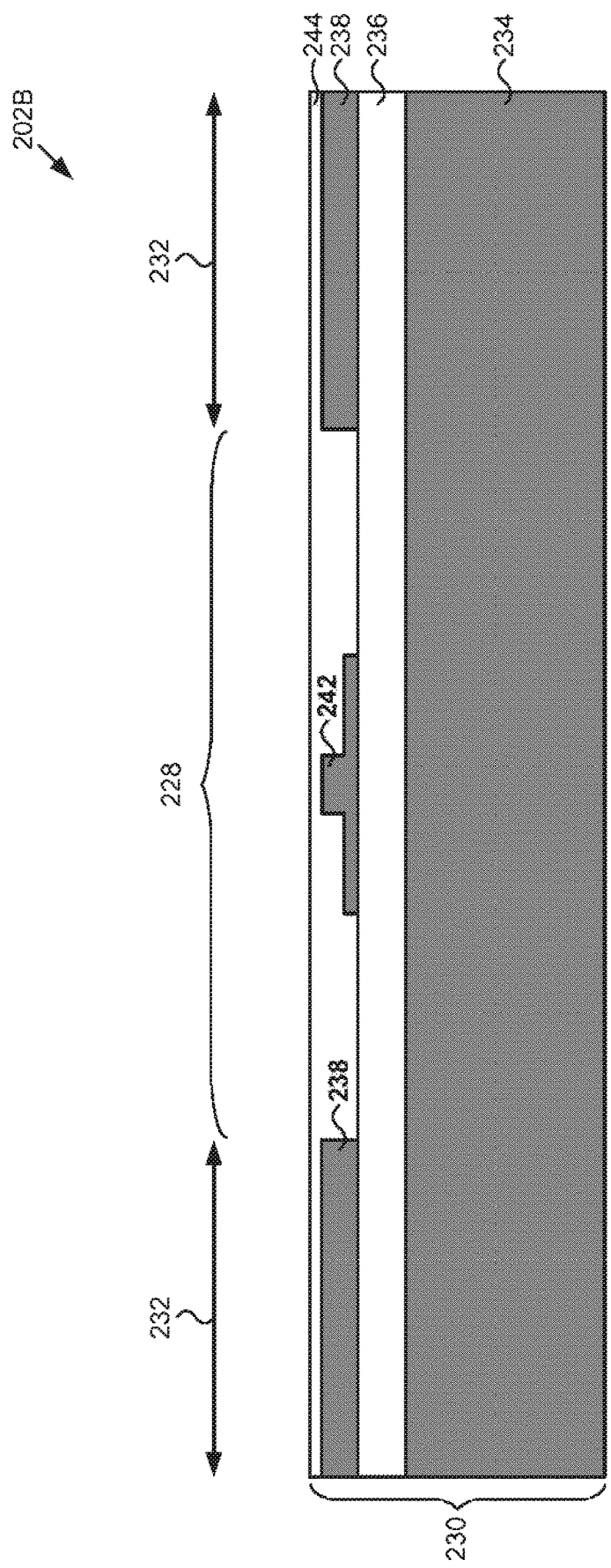
FIG. 2B illustrates a cross-sectional view of a portion of a semiconductor structure corresponding to FIG. 2A processed in accordance with the flowchart of FIG. 1 according to one implementation of the present application.
Figure 3A:
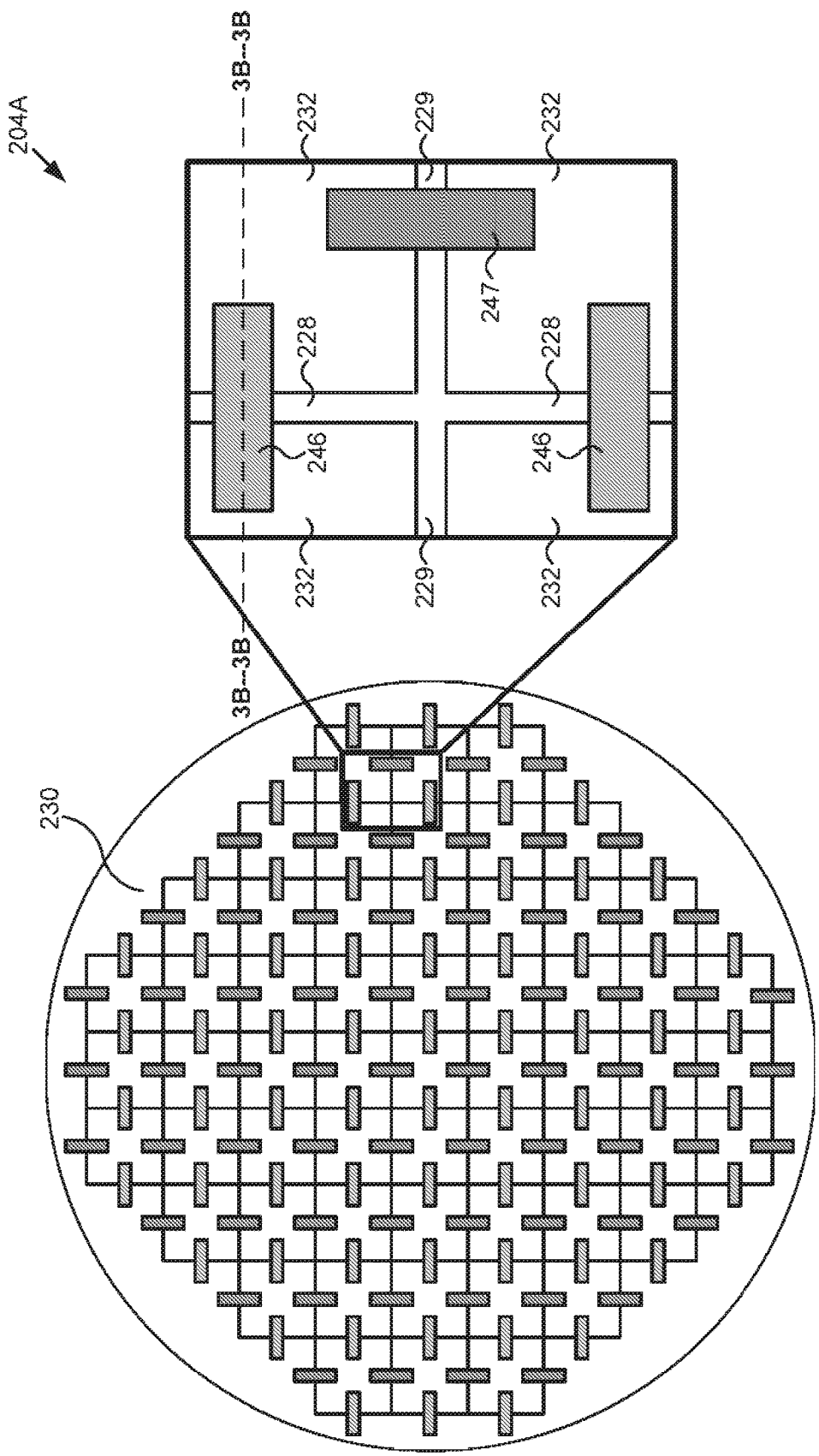
FIG. 3A illustrates a layout of a portion of a semiconductor structure processed in accordance with the flowchart of FIG. 1 according to one implementation of the present application.
Figure 3B:
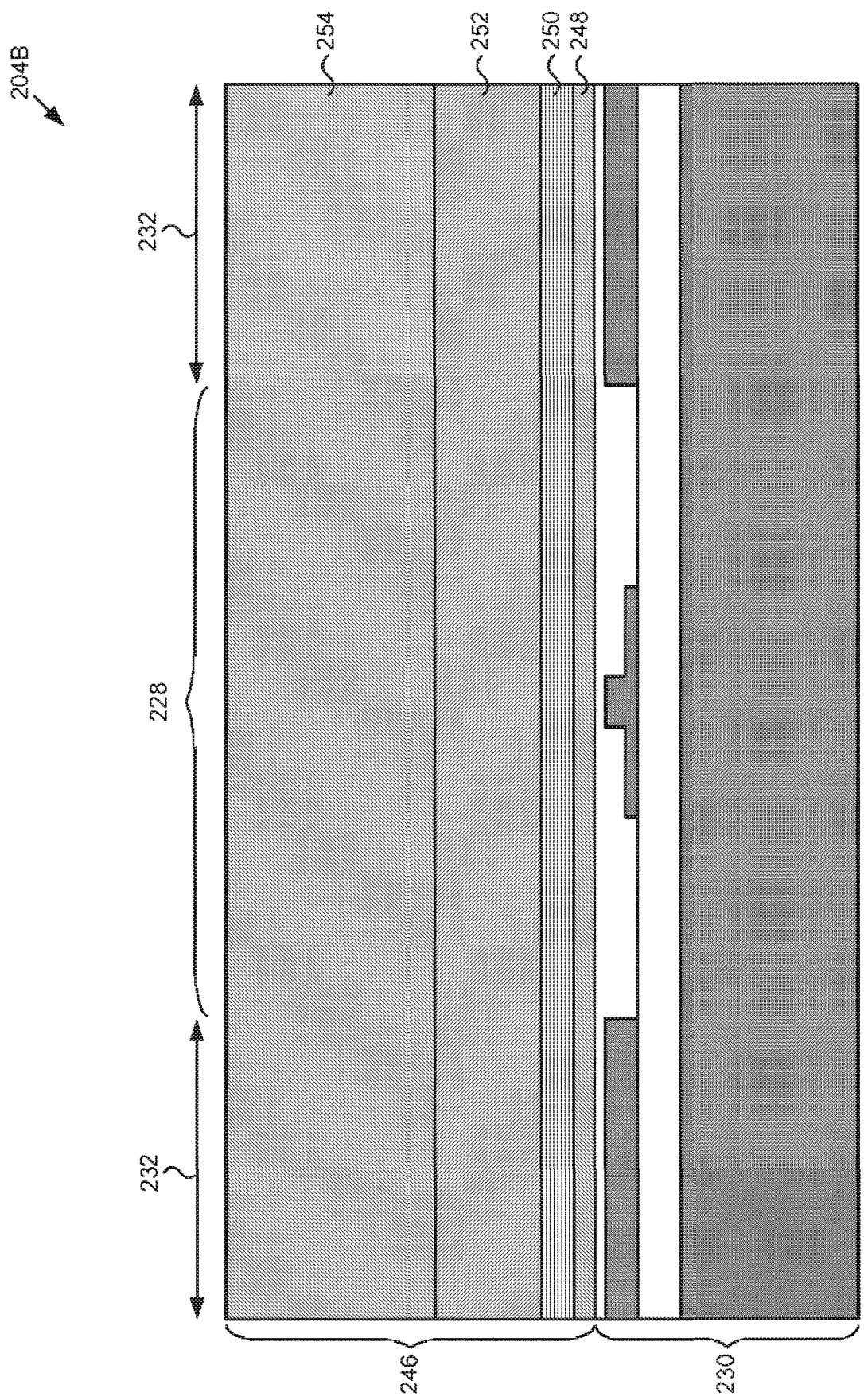
FIG. 3B illustrates a cross-sectional view of a portion of a semiconductor structure corresponding to FIG. 3A processed in accordance with the flowchart of FIG. 1 according to one implementation of the present application.
Figure 4:
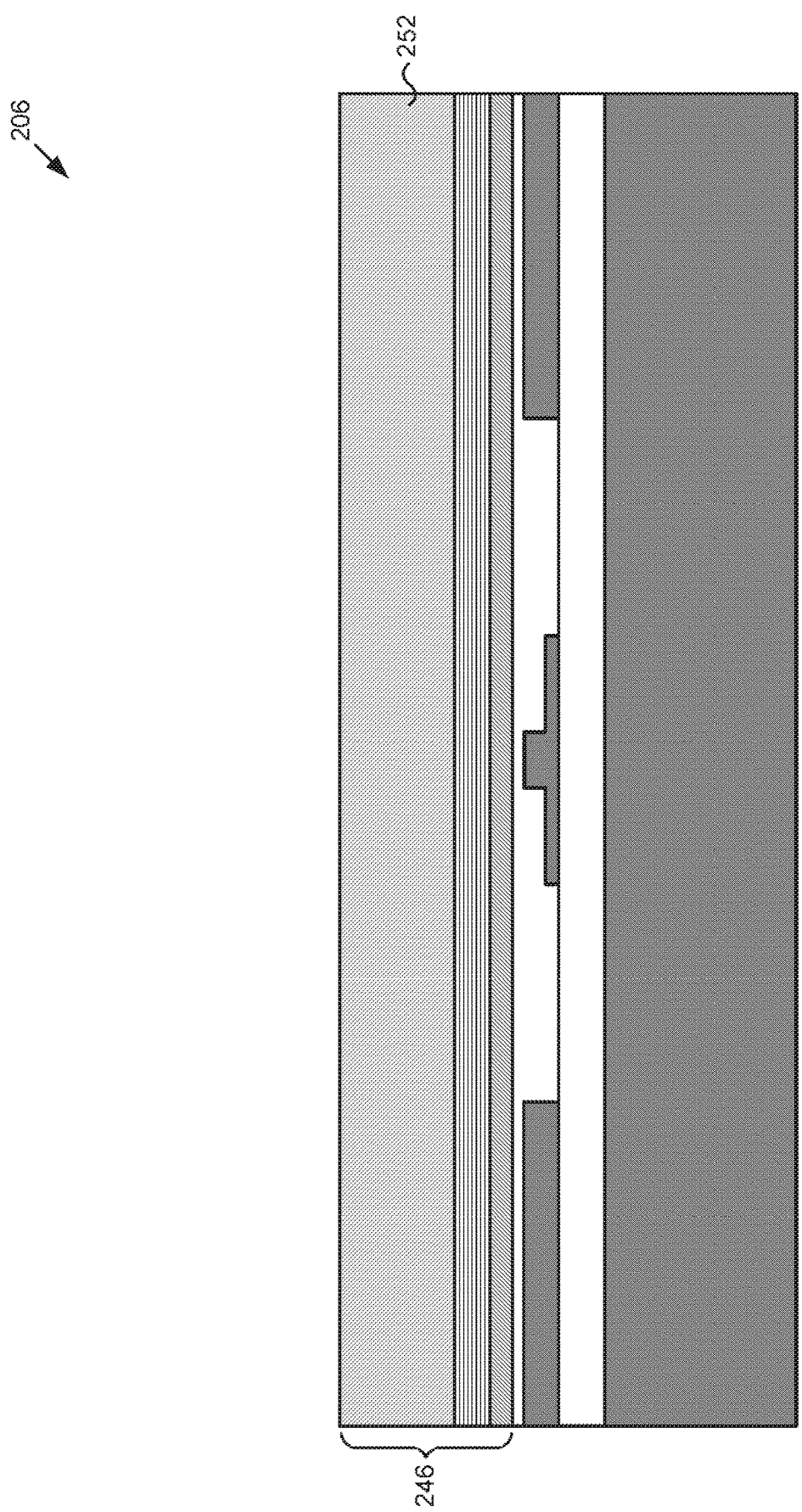
FIG. 4 illustrates a cross-sectional view of a portion of a semiconductor structure processed in accordance with the flowchart of FIG. 1 according to one implementation of the present application.

Structures shown an FIGS. 2A through 6 illustrate the results of performing actions 102 through 112 shown in the flowchart of FIG. 1. For example, FIG. 2A shows a se conductor structure after performing action 102 in FIG. 1, FIG. 3A shows a semiconductor structure after performing action 104 in FIG. 1, FIG. 4 shows a semiconductor structure after performing action 106 in FIG. 1, and so forth.

Actions 102 through 112 shown in the flowchart of FIG. 1 are sufficient to describe one implementation of the present inventive concepts. Other implementations of the present inventive concepts may utilize actions different from those shown in the flowchart of FIG. 1. Certain details and features have been left out of the flowcharts of FIG. 1 that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

FIG. 2A illustrates a layout of a portion of a semiconductor structure processed in accordance with action 102 in the flowchart of FIG. 1 according to one implementation of the present application. As shown in FIG. 2A, semiconductor structure 202A is provided. Semiconductor structure 202A includes group IV substrate 230. As used herein, the phrase "group IV" refers to a semiconductor material that includes at least one group IV element such as silicon (Si), germanium (Ge), and carbon (C), and may also include compound semiconductors such as silicon germanium (SiGe) and silicon carbide (SiC), for example. "Group IV" also refers to semiconductor materials that include more than one layer of group IV elements, or doping of group IV elements to produce strained group IV materials, and may also include group IV based composite substrates such as silicon on insulator (SOI) substrates, separation by implantation of oxygen (SIMOX) process substrates, and silicon on sapphire (SOS) substrates, for example. In one implementation, group IV substrate 230 is an SOI wafer having a diameter of approximately two hundred millimeters (200 mm).

As shown in the expanded view of group IV substrate 230, group IV substrate 230 includes multiple dies 232 separated by scribe lines 228 and 229. Scribe lines 228 are transverse to scribe lines 229. Dies 232 represent spaces where functional group IV devices (not shown in FIG. 2A) can be situated. Scribe lines 228 and 229 represent spaces where group IV substrate 230 can be diced without damaging functional group IV devices situated in dies 232. In one implementation, each of scribe lines 228 and 229 has a width of approximately one hundred microns (100 µm).

In various implementations, group IV substrate 230 can include greater or fewer dies 232 than those shown, by way of examples, on group IV substrate 230 of FIG. 2A. In the present implementation, scribe lines 228 and 229 form a grid pattern and dies 232 have an approximately square shape. In various implementations, scribe lines 228 and 229 and dies 232 can have any other shapes and/or arrangements in group IV substrate 230.

FIG. 2B illustrates a cross-sectional view of a portion of a semiconductor structure corresponding to FIG. 2A processed in accordance with action 102 in the flowchart of FIG. 1 according to one implementation of the present application. FIG. 2B represents a cross-sectional view along a portion of line "2B-2B" in FIG. 2A. As shown in FIG. 2B, semiconductor structure 202B is provided. Semiconductor structure 202B includes group IV substrate 230 having group IV dies 232 separated by scribe line 228. In the present implementation, group IV substrate 230 is an SOI substrate including handle wafer 234, buried oxide (BOX) 236, and top semiconductor 238. Group IV substrate 230 also includes oxide layer 244 over top semiconductor 218.

In providing semiconductor structure 202B, a bonded and etch back SOI (BESOI) process can be used, as known in the art. In a BESOI process, handle wafer 234, BOX 236, and top semiconductor 238 together form an SOI substrate. Alternatively, as also known in the art, a SIMOX process (separation by implantation of oxygen process) or a "smart cut" process can also be used for providing semiconductor structure 202B. In a SIMOX process, handle wafer 234 can be a bulk silicon support wafer (which for ease of reference, may still be referred to as a "handle wafer" in the present application). Similar to a BESOI process, in both SIMOX and smart cut processes, handle wafer 234, BOX 236, and top semiconductor 238 together form an SOI substrate.

In one implementation, handle wafer 234 is undoped silicon. In various implementations, handle wafer 234 has a thickness of approximately seven hundred microns (700 µm) or greater or less. In one implementation, a trap rich layer can be situated between handle wafer 234 and BOX 236. In various implementations, BOX 236 typically comprises silicon dioxide ($SiO_2$), but it may also comprise silicon nitride ($Si_XN_Y$), or another insulator material. In various implementations, BOX 236 has a thickness of approximately one micron (1 µm) or greater or less. In one implementation, top semiconductor 238 includes doped silicon. In various implementations, top semiconductor 238 has a thickness of approximately three hundred nanometers (300 nm) or greater or less. Handle wafer 234, BOX 236, and top semiconductor 238 can be provided together in group IV substrate 230 as a pre-fabricated SOI substrate. In various implementations, as discussed above, group IV substrate 230 may be any other group IV substrate.

Group IV substrate 230 includes group IV device 242 in scribe line 228. In the present implementation, group IV device 242 is an optoelectronic device having optical input/output terminals, or having both electrical and optical input/output terminals. In various implementations, group IV device 242 can be a waveguide, a grating coupler, an interferometer, or a reflector. In other implementations, group IV device 242 can be any other type of group IV device.

Group IV device 242 is formed in top semiconductor 238. In semiconductor structure 202B, part of top semiconductor 238 is removed to isolate group IV device 242. In other implementations, dedicated isolation structures can be used. Other group IV devices (not shown in FIG. 2B) can be integrated in top semiconductor 238, for example, in dies 232. Oxide layer 244 is situated over top semiconductor 238 and group IV device 242 in group IV substrate 230. In various implementations, oxide layer 244 can comprise silicon oxide ($SiO_2$), silicon oxynitride ($Si_XO_YN_Z$), or another dielectric. In various implementations, the height of oxide layer 244 above group IV device 242 can be approximately one hundred nanometers (100 nm).

FIG. 3A illustrates a layout of a portion of a semiconductor structure processed in accordance with action 104 in the flowchart of FIG. 1 according to one implementation of the present application. As shown in FIG. 3A, in semiconductor structure 204A, group III-V chiplets 246 and 247 are placed over group IV substrate 230.

Group III-V chiplets 246 and 247 are unpatterned dies including group III-V semiconductors. As used herein, the phrase "group III-V" refers to a compound semiconductor including at least one group III element, such as indium (In), gallium (Ga), aluminum (Al), and boron (B), and at least one group V element, such as arsenic (As), phosphorus (P), and nitrogen (N). By way of example, a group III-V semiconductor may take the form of indium phosphide (InP). "Group III-V" can also refer to a compound semiconductor that includes an alloy of a group III element and/or an alloy of a group V element, such as indium gallium arsenide ($In_X Ga_{1-X}As$), indium gallium nitride ($In_X Ga_{1-X}N$), aluminum gallium nitride ($Al_X Ga_{1-X}N$), aluminum indium gallium nitride. ($Al_X In_Y Ga_{1-X-Y}N$), gallium arsenide phosphide nitride ($GaAs_A P_B N_{1-A-B}$), and aluminum indium gallium arsenide phosphide nitride ($Al_X In_Y Ga_{1-X-Y}As_A P_B N_{1-A-B}$), for example. "Group III-V" also refers generally to any polarity including but not limited to Ga-polar, N-polar, semi-polar, or non-polar crystal orientations. A group III-V material may also include either the Wurtzitic, Zincblende, or mixed polytypes, and may include single-crystal, monocrystalline, polycrystalline, or amorphous structures.

Group III-V chiplets 246 and 247 can be provided by growing multiple epitaxial layers on a group III-V handle wafer, as described below, and then dicing the group III-V handle wafer and the epitaxial layers into group III-V chiplets 246 and 247, Group III-V chiplets 246 have different epitaxial layers than group III-V chiplets 247. In one implementation, group III-V chiplets 246 and 247 call be formed from an InP wafer having a diameter of approximately one hundred millimeters (100 mm).

As shown in FIG. 3A, group III-V chiplets 246 are placed partially over two dies 232 so as to straddle scribe lines 228. Similarly, group III-V chiplets 247 are placed partially over two dies 232 so as to straddle scribe lines 229. In other implementations, group III-V chiplets 246 and 247 are placed at least partially over scribe lines 228 and 229 without straddling scribe lines 228 and 229. In various implementations, group III-V chiplets 246 or 247 rail be placed over more than two dies 232 and/or over the intersections of scribe lines 228 and 229. As described below, group III-V chiplets 246 and 247 are bonded to group IV substrate 230.

In the present implementation, four group III-V chiplets 246 and 247 are placed over each die 232. In other implementations, more or fewer group III-V chiplets 246 and 247 can be placed over each die 232. In various implementations, not all dies 232 have a chiplet placed thereover. In some implementations only a part of a scribe line, such as scribe lines 228 and 229, is covered by a group III-V chiplet, such as group III-V chiplets 246 and 247. That is, in such implementations, a scribe line may be partially covered, and the group III-V chiplet need not straddle over two or more dies. In the present implementation, group III-V chiplets 246 and 247 with two different types of epitaxial layering are utilized. In various implementations, group III-V chiplets with more or fewer types of epitaxial layering can be utilized.

FIG. 3B illustrates a cross-sectional view of a portion of a semiconductor structure corresponding to FIG. 3A processed in accordance with action 104 in the flowchart of FIG. 1 according to one implementation of the present application. FIG. 3B represents a cross-sectional view along a portion of line "3B-3B" in FIG. 2A. As shown in FIG. 3B, in semiconductor structure 204B, group III-V chiplet 246 is placed over group IV substrate 230 over scribe line 228.

Group III-V chiplet 246 includes doped group III-V layer 248, transition layers 250, doped group III-V layer 252, and group III-V handle wafer 254. Prior to being placed over group IV substrate 230, group III-V chiplet 246 can be fabricated by sequential epitaxial growth of doped group III-V layer 252, transition layers 250, and doped group III-V layer 248 on group III-V handle wafer 254. In various implementations, group III-V handle wafer 254 can be an InP handle wafer having a thickness of approximately two hundred microns (200 µm) or greater or less.

In the present implementation, doped group III-V layer 252 comprises InGaAs implanted with boron or another appropriate P type dopant. In various implementations, doped group III-V layer 252 has a thickness of approximately two microns (2 µm) or greater or less. As known in the art, doped group III-V layer 252 can comprise a thin heavily doped contact layer near group III-V handle wafer 254 and a thick lightly doped cladding layer near transition layers 250. In various implementations, doped group III-V layer 252 can include other group III-V materials instead of or in addition to InGaAs.

In the present implementation, transition layers 250 comprise several undoped InGaAsP layers each having a thickness of approximately ten nanometers (10 nm). These layers function as quantum wells to provide optical gain. As known in the art, transition layers 250 can also comprise confinement layers around the quantum wells and having lower refractive index. In various implementations, transition layers 250 have a combined thickness of approximately two hundred nanometers (200 nm) or greater or less. In various implementations, transition layers 250 can include other group III-V materials instead of or in addition to InGaAsP.

Doped group III-V layer 248 is a group III-V layer having an opposite doping type than doped group III-V layer 252. In the present implementation, doped group III-V layer 248 comprises InP implanted with phosphorus or another appropriate N type dopant. In various implementations, doped group III-V layer 248 has a thickness of approximately one hundred nanometers (100 nm) or greater or less. In various implementations, doped group III-V layer 248 can include other group materials instead of or in addition to InP.

Group III-V chiplet 246 can be bonded to group IV substrate 230 by oxygen plasma assisted direct wafer bonding. The surfaces of group III-V chiplet 246 and group IV substrate 230 can be cleaned, then activated by an oxygen plasma, then placed in physical contact at room temperature to bored. In one implementation, after bonding, a low-temperature anneal can also be performed. For example, semiconductor structure 204B can be annealed at a temperature of approximately three hundred degrees Celsius (300° C.).

In semiconductor structure 204B, doped group III-V layer 252, transition layers 250, and doped group III-V layer 248 form a P-I-N junction. Thus, group III-V chiplet 246 represents an unpatterned group III-V die, suitable for patterning into an optoelectronic device, such as a photodiode or laser. As described below, doped group III-V lavers 248 and 252 can function as an N type cathode and a P type anode, respectively, of a group III-V photodiode. Although an example of N type doped group III-V layer 248 and P type doped group III-V layer 252 is described above, in one implementation, the dopant types can be switched (i.e., P type doped group III-V layer 248 and N type doped group III-V layer 252). In other implementations, group III-V chiplet 246 can have other layering suitable for other devices. In other implementations, some patterning may be performed prior to bonding. In semiconductor structure 204B, group III-V chiplet 246 is shown to overlie both dies 232 and straddle scribe lisle 228. In other implementations, group III-V chiplet 246 may overlie lore or less of dies 232 and scribe line 228. For example, group III-V chiplet 246 can be situated only partially over scribe line 228.

FIG. 4 illustrates a cross-sectional view of a portion of a semiconductor structure processed in accordance with action 106 in the flowchart of FIG. 1 according to one implementation of the present application. As shown in FIG. 4, in semiconductor structure 206, group III-V handle wafer 254 (shown in FIG. 3B) is removed from group III-V chiplet 246.

Group III-V handle wafer 254 (shown in FIG. 3B) can be removed any means known in the art. For example, group III-V handle wafer 254 (shown in FIG. 3B) can be removed by grinding and/or chemical machine polishing (CMP), followed by wet etching using a hydrogen chloride (HCl) mixture. In various implementations, group III-V handle wafer 254 (shown in FIG. 3B) can be selectively etched while doped group III-V layer 252 or another sacrificial layer (not shown) performs as an etch stop.

Figure 5A:
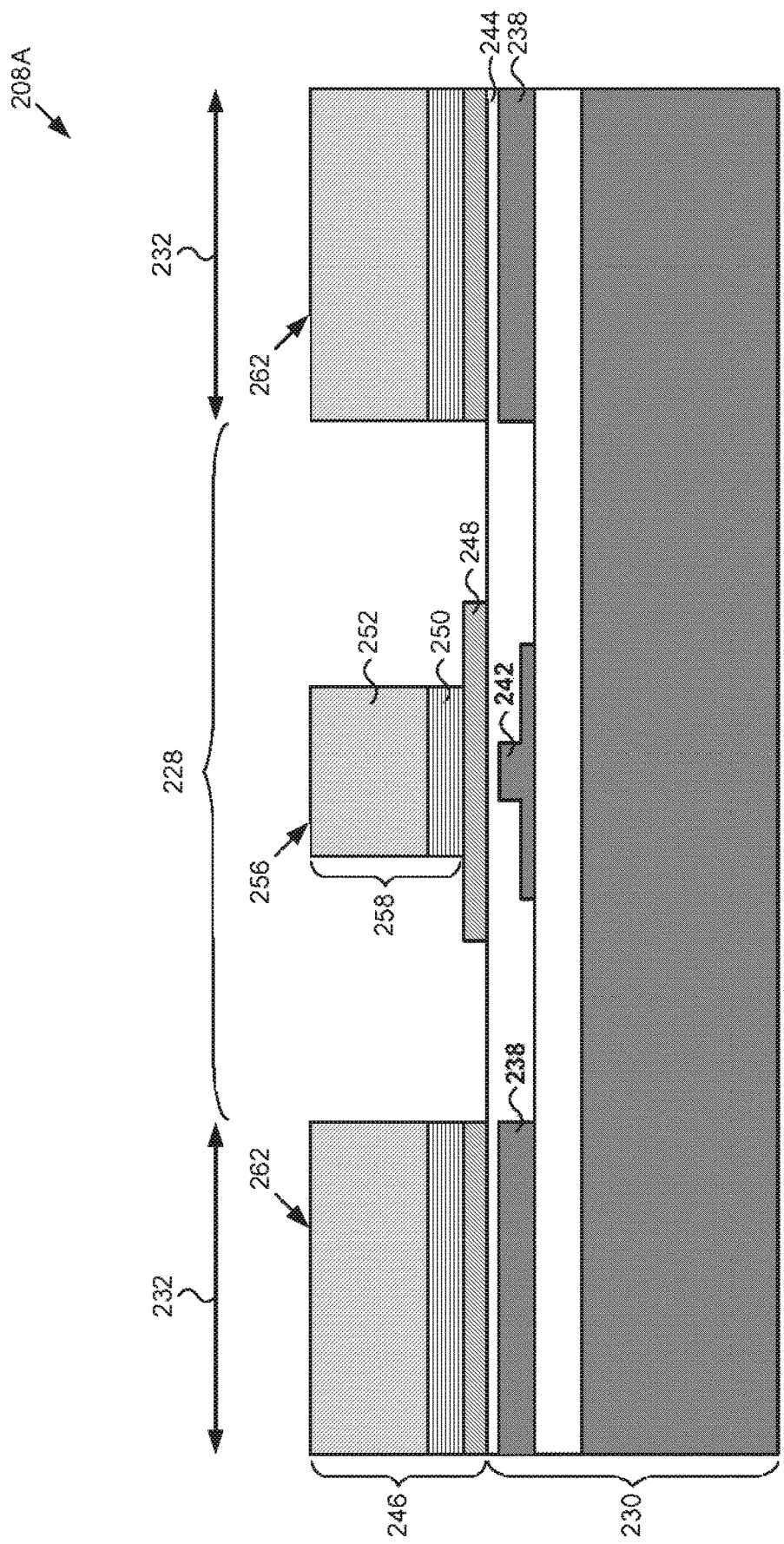
FIG. 5A illustrates a cross-sectional view of a semiconductor structure processed in accordance with the flowchart of FIG. 1 according to one implementation of the present application.

FIG. 5A illustrates a cross-sectional view of a semiconductor structure processed in accordance with action 108 in the flowchart of FIG. 1 according to one implementation of the present application. As shown in FIG. 5A, in semiconductor structure 208A, group III-V chiplet 246 is patterned to produce group III-V process control monitoring device 256 situated over scribe line 228.

Group III-V process control monitoring device 256 can be formed by depositing and patterning a hardmask, for example a $Si_XN_Y$ hardmask, over doped group III-V layer 252, then etching doped group III-V layer 252 using a phosphorus (P) based wet etch. In this implementation, doped group III-V layer 252 may be selectively etched while transition layers 250 perform as an etch stop. Then transition layers 250 can be etched, for example, using a reactive ion etch (RIE). Finally, doped group III-V layer 248 can be etched, for example, by patterning another mask and using a bromine (Br) based wet etch.

In the present implementation, group III-V process control monitoring device 256 is a group III-V photodiode, and doped group III-V layers 248 and 252 function as an N type cathode and a P type anode, respectively, of group III-V process control monitoring device 256. As shown in FIG. 5A, after forming group III-V process control monitoring device 256, group III-V mesa 258 is situated over doped group III-V layer 248. Group III-V mesa 258 includes transition layers 250 and doped group III-V layer 252. In order for group III-V process control monitoring device 256 to avoid significant optical losses, in various implementations, a height of group III-V mesa 258 may be approximately two microns (2 µm) or greater. In various implementations, group III-V process control monitoring device 256 can be a solar cell, a laser, a gating coupler, a waveguide, an optical modulator, an attenuator, an interferometer, and a reflector, or any other type of patterned group III-V device. In various implementations, semiconductor structure 208A can include additional patterned group III-V devices (not shown in FIG. 5A) in group III-V chiplet 246.

Group III-V process control monitoring device 256 is optically connected to group IV device 242 in group IV substrate 230. Group III-V process control monitoring device 256 is approximately aligned with group IV device 242. Group III-V process control monitoring device 256 is separated from group IV device 242 by a thin portion of oxide layer 244 that was used to protect top semiconductor 238 and group IV device 242 during placement action 104 (shown in FIG. 3B). As described above, in various implementations, group IV device 242 can be a waveguide, a grating coupler, an interferometer, or a reflector. In one implementation, group IV device 242 may couple light to/from group III-V process control monitoring device 256 from/to another plane not visible in the cross-sectional view of FIG. 5A. In another implementation, group IV device 242 may couple light to/from group III-V process control monitoring device 256 from/to a bottoms of group IV substrate 230. In various implementations, group III-V process control monitoring device 256 can be optically connected to additional group IV devices (not shown in FIG. 5A) in scribe line 228. Similarly, group IV device 242 can be optically connected to additional group IV devices (not shown in FIG. 5A) in scribe line 228 and/or to an optical input/output interface (not shown in FIG. 5A).

As shown in FIG. 5A, functional group III-V device regions 262 of group III-V chiplet 246 are situated over dies 232 of group IV substrate 230. Functional group III-V device regions 262 can be patterned as described above to produce functional group III-V optoelectronic devices (not shown in FIG. 5A) situated over dies 232. Functional group III-V optoelectronic devices in functional group III-V device regions 262 can share an epitaxial layer with group III-V process control monitoring device 256. Functional group III-V optoelectronic devices in functional group III-V device regions 262 can also be connected to functional group IV devices integrated in top semiconductor 238.

FIG. 5B illustrates a layout of a portion of a semiconductor structure corresponding to FIG. 5A processed in accordance with action 108 in the flowchart of FIG. 1 according to one implementation of the present application. FIG. 5A represents a cross-sectional view along a portion of line "5A-5A" in FIG. 5B. The layout in FIG. 5B generally corresponds to the layout in FIG. 3A. As shown in FIG. 5B, in semiconductor structure 208B, group III-V chiplets 246 (shown in FIG. 3A) are patterned to produce group III-V process control monitoring devices 256 situated over scribe line 228. Functional group III-V device regions 262 are also situated over dies 232. As described above, functional group III-V device regions 262 can include functional group III-V optoelectronic devices that share an epitaxial layer with group III-V process control monitoring devices 256.

Similarly, group III-V chiplets 247 (shown in FIG. 3A) are patterned to produce group III-V process control monitoring device 257 situated over scribe line 229. Functional group III-V device regions 263 are also situated over dies 232. Group III-V process control monitoring device 257 and functional group III-V device regions 263 can have different epitaxial layers, dimensions, and/or patterning than group III-V process control monitoring devices 256 and functional group III-V device regions 262.

Although group III-V chiplets 246 and 247 (shown in FIG. 3A) can all be patterned differently, fabrication can be simplified where similar group III-V process control monitoring devices are patterned in each scribe line. For example, a first type of group III-V process control monitoring device 256 can be situated over each vertical scribe line 228 while a second type of group III-V process control monitoring device 257 can be situated over each horizontal scribe line 229. As another example, each vertical scribe line 228 can correspond to one type of group III-V process control monitoring device 256 that is different from that of an adjacent vertical scribe line. Group III-V chiplets 246 and 247 (shown in FIG. 3A) can be patterned to produce more or fewer group III-V process control monitoring devices 256 and 257 and/or functional group III-V device regions 262 and 263 than shown in FIG. 5B.

Figure 6:
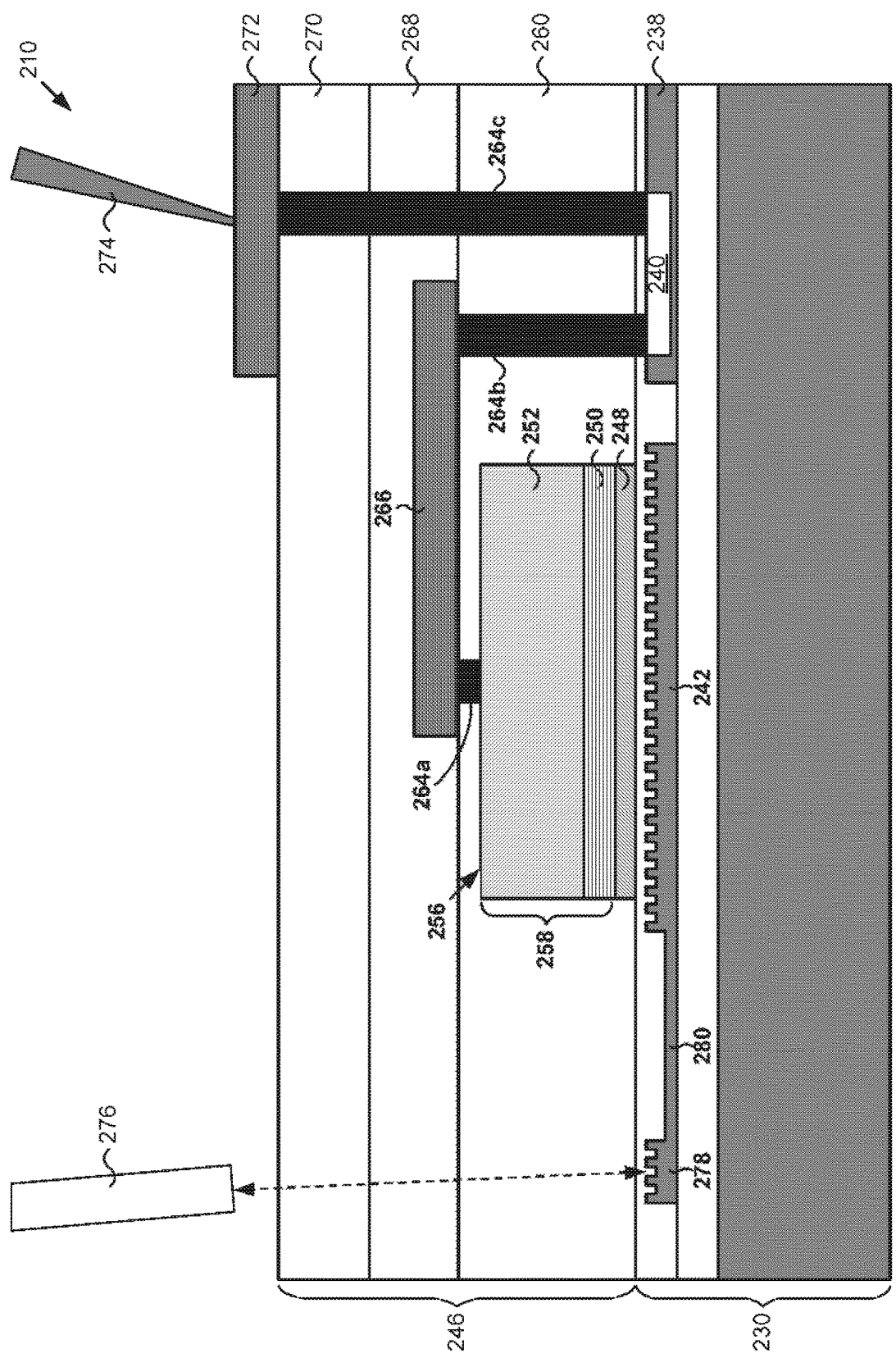
FIG. 6 illustrates a cross-sectional view of a portion of a semiconductor structure processed in accordance with the flowchart of FIG. 1 according to one implementation of the present application.

FIG. 6 illustrates a cross-sectional view of a portion of a semiconductor structure processed in accordance with action 110 in the flowchart of FIG. 1 according to one implementation of the present application. FIG. 6 represents a cross-sectional view along a portion of line "6-6" in FIG. 5B, after additional elements are formed over semiconductor structure 208B. As shown in FIG. 6, in semiconductor structure 210, group III-V process control monitoring device 256 can be tested.

Group IV substrate 230 includes group IV devices 240, 242, 278, and 280. Group IV device 240 is formed in top semiconductor 238. In the present implementation, group IV device 240 is an electrical device. In various implementations, group IV device 240 can be a transistor, an operational amplifier, a driver, a filter, a mixer, or a diode. In various implementations, group IV device 240 can be an active circuit comprising multiple active devices, or comprising passive devices in combination with at least one active device. As described above, in the present implementation, group IV device 242 can be an optoelectronic device such as a waveguide, a grating coupler, an interferometer, or a reflector. Group IV devices 278 and 280 are coupled to group IV device 242. In the present implementation, group IV device 278 can be a grating coupler, and group IV device 280 can be a waveguide. In other implementations, group IV devices 240, 278, and 280 can be any other types of group IV devices. In various implementations, semiconductor structure 210 can include additional group IV devices. For example, an interferometer can be coupled to group IV device 280.

Semiconductor structure 210 includes dielectric layers 260, 268, and 270, vias 264a, 264b, and 264c, interconnect metal 266, and contact pad 272 that can be built as part of a back-end-of-line (BEOL) multi-level metallization (MLM). Dielectric layer 260 is situated over group III-V process control monitoring device 256 and over portions of group IV substrate 230. Dielectric layer 268 is situated over dielectric layer 260 and can be, for example, a first metallization level. Dielectric layer 270 is situated over dielectric layer 268 and can be, for example, an interlayer dielectric. Semiconductor structure 210 can include additional metallization levels and/or additional interlayer dielectrics (not shown in FIG. 6). In various implementations, dielectric layers 260, 268, and 270 can comprise $SiO_2$, $Si_xN_y$, or another dielectric.

Vias 264a, 264b, and 264c, interconnect metal 266, and contact pad 272 are electrically coupled to group III-V process control monitoring device 256 and group IV device 240. In particular, via 264a, interconnect metal 266, and via 264b create a direct path electrically coupling group III-V process control monitoring device 256 in group III-V chiplet 246 to group IV device 240 in group IV substrate 230. Where group III-V process control monitoring device 256 is, for example, a photodiode, group IV device 240 can be part of a readout circuit for group III-V process control monitoring device 256. Via 264c creates a direct path electrically coupling group IV device 240 to contact pad 272. In various implementations, vias 264a, 264b, and 264c, interconnect metal 266, and contact pad 272 can comprise tungsten (W), aluminum (Al), or copper (Cu). In various implementations, group III-V process control monitoring device 256 can be electrically coupled to additional group IV devices in group IV substrate 230. In various implementations, group III-V process control monitoring device 256 can be electrically coupled to group IV devices in dies 232 (shown in FIG. 5B) instead of or in addition to group IV devices in scribe line 228 (shown in FIG. 5B).

Group IV devices 242, 278, and 280 are optically coupled to group III-V process control monitoring device 256. In particular, group IV device 242 and group IV device 280 create a direct path optically connecting group III-V process control monitoring device 256 in group III-V chiplet 246 to group IV device 278 in group IV substrate 230. Where group III-V process control monitoring device 256 is, for example, a photodiode, group IV device 278 can be part of an optical input for group III-V process control monitoring device 256. In various implementations, group III-V process control monitoring device 256 can be optically coupled to additional group IV devices in group IV substrate 230. In various implementations, group III-V process control monitoring device 256 can be optically coupled to group IV devices in dies 232 (shown in FIG. 5B) instead of or in addition to group IV devices in scribe line 228 (shown in FIG. 5B).

Contact pad 272 interfaces with electrical probe 274. Electrical probe 274 provides electrical signals to and receives electrical signals from group III-V process control monitoring device 256 and group IV device 240. Electrical probe 274 can be part of a probe card (not shown in FIG. 6) used to test optoelectronic devices. Electrical probe 274 can be coupled to electrical test equipment (not shown in FIG. 6) for providing electrical signals to and receiving electrical signals from electrical probe 274.

Group IV device 278 interfaces optical probe 276. Optical probe 276 provides optical signals to and receives optical signals from group III-V process control monitoring device 256. Optical probe 276 transmits and receives light along the path illustrated by dotted arrows in FIG. 6. Group IV device 278 couples light from optical probe 276 into a different plane, such that the light can be routed to group III-V process control monitoring device 256. Optical probe 276 calm be part of a probe card (not shown in FIG. 6) used to test optoelectronic devices probe 276 can be coupled to a tunable laser (not shown in FIG. 6), or to other optical test equipment for providing optical signals to and receiving optical signals from optical probe 276. In the present implementation, optical probe 276 is a single mode fiber. In various implementations, optical probe 276 may be a multimode fiber, or any other type of optical probe.

By coupling electrical probe 274 and optical probe 276 to group III-V process control monitoring device 256, various process characteristics can be measured. For example, by providing an optical test signal from optical probe 276 to group III-V process control monitoring device 256 and measuring an output electrical using electrical probe 274, it may be possible to evaluate whether transition layers 250 provide a certain gain, or whether group IV devices 242 278, and 280 achieve a certain refractive index. In various implementations, group III-V process control monitoring device 256 can be utilized to test other process parameters, such as whether doped group III-V layers 248 and 252 achieve a certain doping profile or a certain contact resistance.

In various implementations, group III-V process control monitoring device 256 can be tested using other test equipment instead of or in addition to electrical probe 274 and/or optical probe 276. For example, a temperature gradient of group III-V process control monitoring device 256 can be tested. In various implementations, group III-V process control monitoring device 256 can be tested prior to forming additional elements over group III-V process control monitoring device 256. For example, group III-V process control monitoring device 256 can be tested by microscopic inspection of etch chemistries utilized to form group III-V mesa 258 after patterning action 108.

Referring back to FIG. 5B, after testing group III-V process control monitoring devices 256 and 257, group IV substrate 230 can be diced through scribe limes 228 and 229 in accordance with action 112 in the flowchart of FIG. 1.

Dicing detaches dies 232 from each other. Dicing also removes group III-V process control monitoring devices 256 and 257, leaving functional group III-V device regions 262 and 263. Dicing can be performed using any technique known in the art, such as slurry sawing, diamond sawing, or laser grooving and breaking.

Semiconductor structures according to the present invention, such as semiconductor structure 208B in FIG. 5B, result in several advantages. First, group III-V process control monitoring devices 256 and 257 can be tested in order to evaluate process characteristics for devices and/or or layers in dies 232 of group IV substrate and/or in functional group III-V device regions 262. Second, because group III-V process control monitoring devices 256 and 257 are situated over scribe lines 228 and 229, group III-V process control monitoring devices 256 and 257 can be removed and discarded during dicing. No dies need to be reserved for process control monitoring, all dies 232 can be dedicated to functional devices, and productivity, is increased. Third, the present invention is particularly advantageous in large scale a act Conventional techniques involving placing pre-patterned monitoring devices aligned over narrow scribe lines 228 and 229 are typically complex and inaccurate. In contrast, because group III-V chiplets 246 and 247 are placed at least partially over scribe lines 228 and 229, and then patterned to produce group III-V process control monitoring devices 256 and 257, complexity and inaccuracy are significantly reduced.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor structure comprising:
a group IV substrate including group IV dies separated by a scribe line;
functional group IV devices situated in said group IV dies;
a patterned group III-V device situated over said scribe line;
a functional group III-V optoelectronic device situated over one of said group IV dies;
said functional group III-V optoelectronic device situated at an edge of said one of said group IV dies and situated adjacent to said patterned group III-V device along said edge;
wherein said functional group III-V optoelectronic device and said patterned group III-V device are situated along a line perpendicular to said edge;
another patterned group III-V device situated over another scribe line;
wherein said scribe line is horizontal and said another scribe line is vertical;
wherein said patterned group III-V device is different from said another patterned group III-V device.

2. The semiconductor structure of claim 1, wherein said functional group III-V optoelectronic device shares an epitaxial layer with said patterned group III-V device.

3. The semiconductor structure of claim 1, wherein said patterned group III-V device is configured to interface with an electrical probe.

4. The semiconductor structure of claim 1, wherein said patterned group III-V device is configured to interface with an optical probe.

5. The semiconductor structure of claim 1, wherein said patterned group III-V device is a photodiode.

6. The semiconductor structure of claim 1, wherein said patterned group III-V device is electrically or optically coupled to a group IV device in said group IV substrate.

7. The semiconductor structure of claim 1, further comprising another functional group III-V optoelectronic device situated at another edge of said one of said group IV dies and situated adjacent to said another patterned group III-V device along said another edge.

8. The semiconductor structure of claim 1, wherein said functional group III-V optoelectronic device and said patterned group III-V device are substantially centered along said line perpendicular to said edge.

9. The semiconductor structure of claim 1, wherein each patterned group III-V device in said horizontal scribe line is different from each patterned group III-V device in said vertical scribe line.

10. The semiconductor structure of claim 1, further comprising:
a plurality of other edges of said one of said group IV dies;
a plurality of other functional group III-V optoelectronic devices situated over said one of said group IV dies;
wherein at least one of said plurality of other functional group III-V optoelectronic devices is situated at each of said plurality of other edges.

11. A method comprising:
providing a group IV substrate including group IV dies separated by a scribe line;
wherein functional group IV devices are situated in said group IV dies;
placing a group III-V chiplet over said group IV substrate and at least partially over said scribe line;
patterning said group III-V chiplet to produce a patterned group III-V device situated over said scribe line;
forming a functional group III-V optoelectronic device situated over one of said group IV dies;
said functional group III-V optoelectronic device situated at an edge of said one of said group IV dies and situated adjacent to said patterned group III-V device along said edge;
wherein said functional group III-V optoelectronic device and said patterned group III-V device are situated along a line perpendicular to said edge;
producing another patterned group III-V device situated over another scribe line;
wherein said scribe line is horizontal and said another scribe line is vertical;
wherein said patterned group III-V device is different from said another patterned group III-V device.

12. The method of claim 11, wherein said placing comprises placing said group III-V chiplet at least partially over two or more of said group IV dies so as to straddle said scribe line.

13. The method of claim 11, wherein said functional group III-V optoelectronic device shares an epitaxial layer with said patterned group III-V device.

14. The method of claim 11, further comprising dicing said group IV substrate through said scribe line.

15. The method of claim 11, wherein said patterned group III-V device is a photodiode.

16. The method of claim 11, wherein said patterned group III-V device is electrically or optically coupled to a group IV device in said group IV substrate.

17. The method of claim 11, further comprising forming another functional group III-V optoelectronic device situated at another edge of said one of said group IV dies and situated adjacent to said another patterned group III-V device along said another edge.

18. The method of claim 11, wherein said functional group III-V optoelectronic device and said patterned group III-V device are substantially centered along said line perpendicular to said edge.

19. The method of claim 11, wherein each patterned group III-V device in said horizontal scribe line is different from each patterned group III-V device in said vertical scribe line.

20. The method of claim 11, further comprising:
providing a plurality of other edges of said one of said group IV dies;
forming a plurality of other functional group III-V optoelectronic devices situated over said one of said group IV dies;
wherein at least one of said plurality of other functional group III-V optoelectronic devices is situated at each of said plurality of other edges.

* * * * *